(12) United States Patent  (10) Patent No.: US 8,159,211 B2
Wang et al.  (45) Date of Patent: *Apr. 17, 2012

(54) CLAMP JAW ASSEMBLY

(75) Inventors: Yong Wang, Shanghai (CN); Yinhong Yang, Shanghai (CN)

(73) Assignee: Fluke Corporation, Everett, WA (US)

( * ) Notice: Subject to any disclaimer, the term of this patent is extended or adjusted under 35 U.S.C. 154(b) by 4 days.

This patent is subject to a terminal disclaimer.

(21) Appl. No.: 12/979,216

(22) Filed: Dec. 27, 2010

(65) Prior Publication Data

US 2011/0101960 A1  May 5, 2011

Related U.S. Application Data

(63) Continuation of application No. 11/848,094, filed on Aug. 30, 2007, now Pat. No. 7,884,598.

(51) Int. Cl.
*G01R 15/18* (2006.01)

(52) U.S. Cl. .............. 324/127; 324/117 R; 324/117 H; 324/126

(58) Field of Classification Search ............ 324/127
See application file for complete search history.

(56) References Cited

U.S. PATENT DOCUMENTS

| | | | |
|---|---|---|---|
| 2,901,705 A | 8/1959 | Lamb | |
| 3,793,166 A | 2/1974 | Shaw | |
| 4,071,824 A | 1/1978 | Kernander | |
| 4,283,677 A | 8/1981 | Niwa | |
| 4,316,142 A | 2/1982 | Kuramoto | |
| 4,384,289 A | 5/1983 | Stillwell | |
| 4,635,055 A | 1/1987 | Fernandes | |
| 4,656,418 A | 4/1987 | Boston | |
| 4,709,339 A | 11/1987 | Fernandes | |
| 4,728,887 A | 3/1988 | Davis | |
| 4,825,154 A | 4/1989 | Cross | |
| 5,039,970 A * | 8/1991 | Cox | 336/107 |
| 5,307,008 A | 4/1994 | So | |
| 5,349,289 A | 9/1994 | Shirai | |
| 5,426,360 A | 6/1995 | Maraio | |
| 5,488,291 A | 1/1996 | Koide | |
| 5,610,512 A | 3/1997 | Selcuk | |
| 5,825,175 A * | 10/1998 | Selcuk | 324/117 H |
| 6,456,060 B1 * | 9/2002 | Wiesemann | 324/127 |
| 6,541,955 B2 * | 4/2003 | Landre | 324/127 |
| 7,288,929 B2 * | 10/2007 | Prsha et al. | 324/127 |
| 7,557,563 B2 | 7/2009 | Gunn | |
| 7,750,621 B1 | 7/2010 | Liu | |
| 7,777,605 B2 | 8/2010 | Zumoto | |

* cited by examiner

*Primary Examiner* — Richard Isla Rodas
(74) *Attorney, Agent, or Firm* — Christensen O'Connor Johnson Kindness PLLC

(57) ABSTRACT

A clamp jaw assembly for a clamp meter is provided. The clamp jaw assembly comprises a housing containing a clamp jaw core disposed within a shield. The housing, shield, and core of the clamp jaw assembly are configured to provide an extended creepage and clearance path from an exterior of the housing to a surface of the core.

11 Claims, 5 Drawing Sheets

CLAMP JAW ASSEMBLY

CROSS-REFERENCE TO RELATED APPLICATION

This application is a continuation of U.S. application Ser. No. 11/848,094, filed Aug. 30, 2007, the entire disclosure of which is incorporated herein by reference.

BACKGROUND

A digital multimeter (DMM) is an electronic test instrument that measures electrical current in a wire without the need to electrically isolating the wire. Such multimeters are typically used to measure a variety of electrical parameters, such as voltage, resistance and current. Clamp-type DMMs, also known as "clamp meters", measure current in a conductor without having to make an electrical connection with a circuit. Instead, such DMMs include two clamp jaws having embedded electrical coils. In use, the jaws are clamped onto a conductor and measure the current within the conductor.

If the conductors are bundled together in a tight physical space, such as an electrical cabinet, it is often difficult to insert the clamp meter into the small area to measure an individual wire. As such, it is desirable to size the jaws of the clamp meter to fit within tight spaces. One way to reduce the size of the jaws is to minimize any space between the jaw core and the housing that surrounds the jaw core. However, reducing the space between the housing and the core can lead to safety issues.

The international standard for test equipment safety, IEC 61010-1, requires a minimum creepage and clearance path between the outside of the jaw housing and the nearest metallic part or circuit board inside the instrument, which is typically the jaw core. "Clearance" is the shortest distance through the air between two conductive elements. In this case, the first conductive element would be a user's hand disposed on the exterior of the housing, and the second conductive element would be the core disposed within the jaw. "Creepage" is the shortest distance along the surface of the insulative material between two conductive elements. The interior of the housing and the core are typically separated from each other by air and/or an insulative material. Reducing the air gap or the thickness of the insulative material decreases the overall size of the jaw, but it would also reduce the creepage and clearance path and would violate safety standards.

One known solution for reducing the overall size of the jaw of a clamp meter without reducing the clearance and creepage path includes covering at least a portion of the jaw core with an insulating tape. The tape increases the clearance path along the jaw core without adding any distance between the jaw core and the jaw housing. Although effective, the tape needs to be manually applied to the curved surfaces of the jaw core, which is time consuming and difficult to apply. Often the tape is applied unevenly and it can crease or wrinkle when adhered to a curved surface. Creases, wrinkles, and uneven application of the tape can decrease the creepage and clearance path, thereby violating safety standards and putting a user at risk. Accordingly, there is a need for a safe, easy method of increasing the creepage and clearance path in a clamp meter jaw assembly.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

A method of manufacturing a clamp jaw assembly for a clamp meter is provided, as well as a clamp jaw assembly and a clamp meter including the clamp jaw assembly. The method includes providing a clamp jaw core and a shield having a channel. The method further includes positioning the clamp jaw core within the channel of the shield such that the shield surrounds a portion of the clamp jaw core. The method also includes enclosing the clamp jaw core and the shield within a clamp jaw housing.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
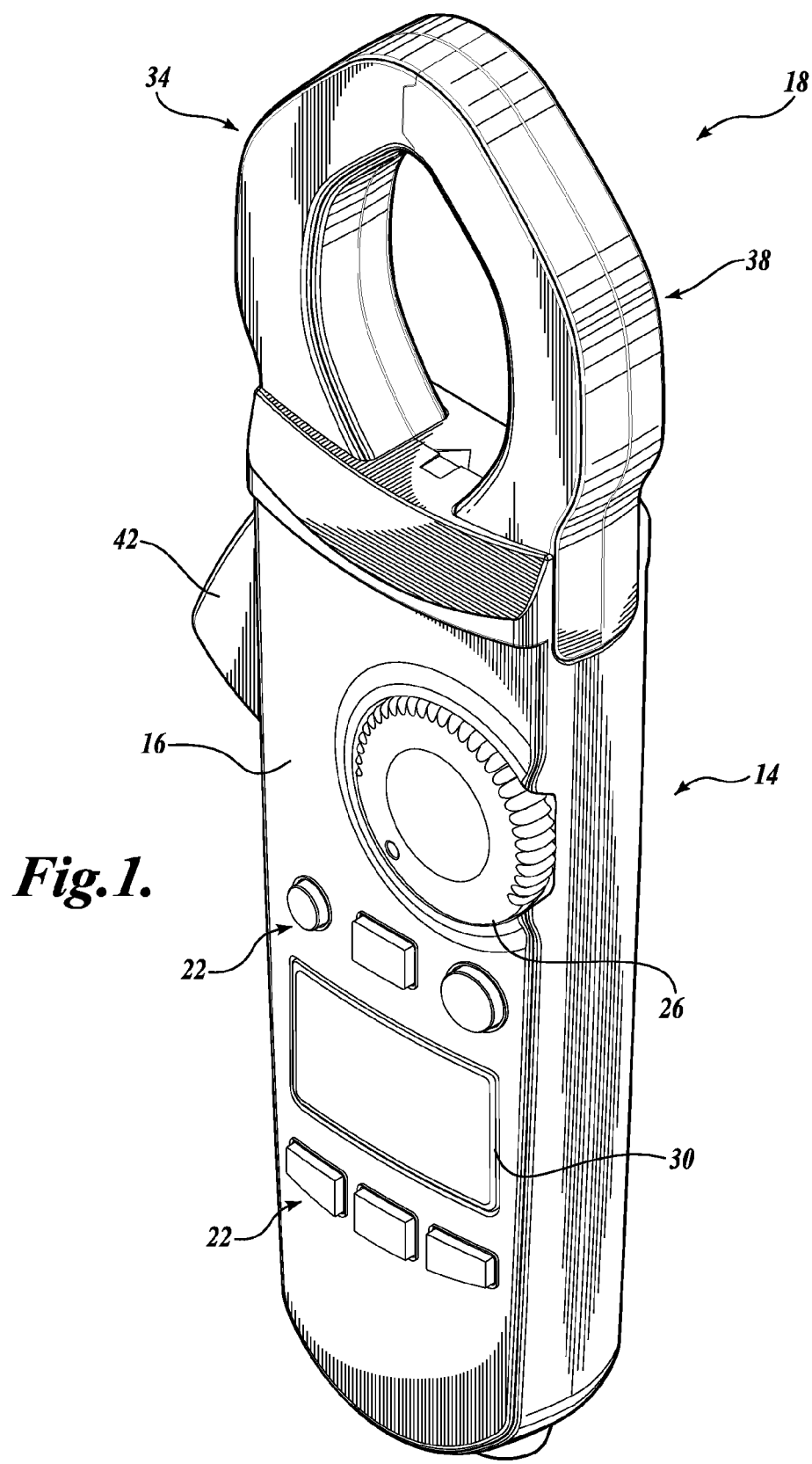
FIG. 1 is an isometric view of a clamp meter illustrated in accordance with one embodiment of the present disclosure.

A clamp meter 10 constructed in accordance with one embodiment of the present disclosure is best seen by referring to FIG. 1. The clamp meter 10 includes a body 14 and a clamp assembly 18 extending from the clamp meter 10. The body 14 includes a body housing 16 made of a durable lightweight material, such as plastic, and is adapted to enclose typical electrical and mechanical components of the clamp meter 10. A plurality of input and output components are disposed on the exterior of the body housing 16, including a plurality of pushbuttons 22 for selecting one or more test functions of the clamp meter 10 and a selector knob 26 for selecting an electrical measurement mode. The clamp meter 10 may further include a display 30 for displaying measurements taken by the clamp assembly 18.

The clamp assembly 18 includes first and second clamp jaws 34 and 38. The first clamp jaw 34 is mounted at its lower end within the body housing 16 for pivoting movement relative to the second clamp jaw 38 which is fixedly secured within the body housing 16. The first and second jaws 34 and 38 have an arcuate shape and are adapted to meet at their upper ends to define an enclosed area therebetween for measuring current within a conductor.

The first clamp jaw 34 is moveable between open and closed positions by operation of a trigger 42. The trigger 42 is integrally formed on the first clamp jaw 34. Depression of the trigger 42 towards the body housing 16 rotates the first clamp jaw 34 about its pivot point away from the fixed second clamp jaw 38 and into the open position. Once the first clamp jaw 34 is in the open or first position, the clamp meter 10 can be manipulated to position the first and second clamp jaws 34 and 38 around a conductor (not shown). The first clamp jaw 34 is preferably spring-biased into the closed position against the second clamp jaw 38 such that the first clamp jaw 34 is maintained in the closed position until the trigger 42 is depressed.

Figure 2:
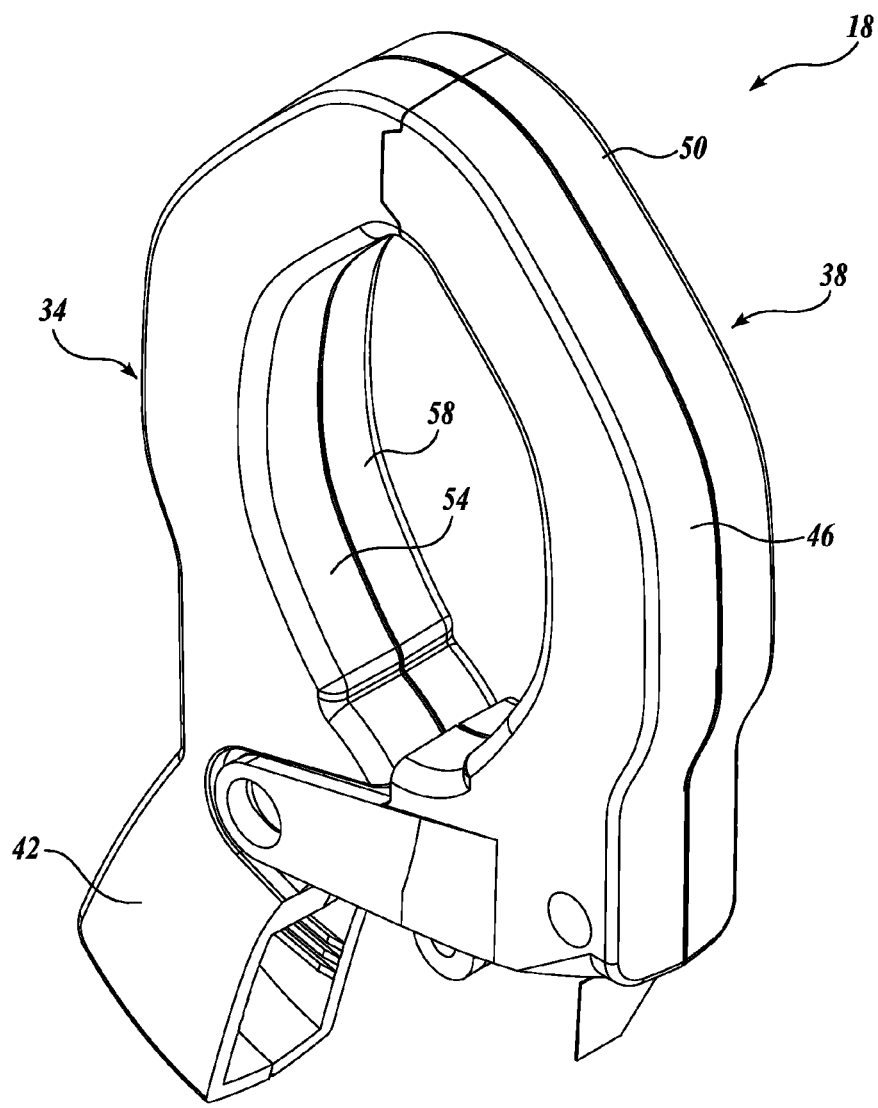
FIG. 2 is an isometric view of a clamp jaw assembly of the clamp meter of FIG. 1 with the clamp meter housing removed for clarity.
Figure 3:
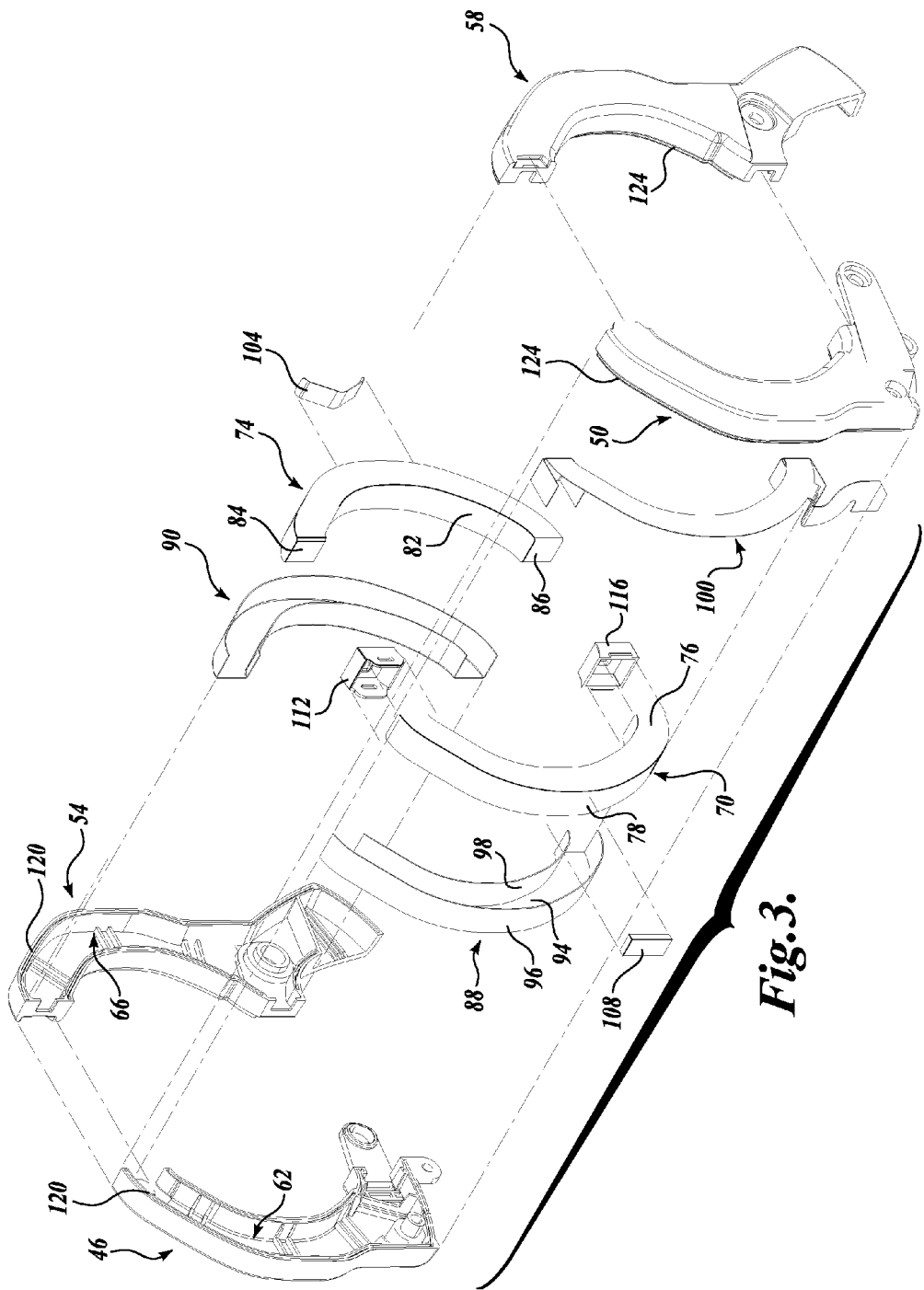
FIG. 3 is an exploded view of the clamp jaw assembly of FIG. 2.

As may be best seen by referring to FIGS. 2 and 3, the first and second clamp jaws 34 and 38 each include a housing for enclosing internal components. The housing of the first clamp jaw 34 includes a top and bottom housings 46 and 50 securable together in any suitable manner known to one of ordinary skill in the art. Similarly, the housing of the second clamp jaw 38 includes a second clamp jaw top housing 54 and a second clamp jaw bottom housing 58 securable together. The top and bottom housings 46 and 50 of the first clamp jaw 34 and the top and bottom housings 54 and 58 define a first internal cavity 62 and a second internal cavity 66, respectively. When assembled, the first and second internal cavities 62 and 66 house the internal components of the first and second clamp jaws 34 and 38.

Referring to FIG. 3, the internal components of the first clamp jaw 34 include a first jaw core 70, a first shield 88, and a flexible printed circuit board (PCB) 100. The internal components of the second clamp jaw 38 include a second jaw core 74 and a second shield 90. The first and second jaw cores 70 and 74 are made from electrical coils in a manner well known in the art such that the first and second jaw cores 70 and 74 are adapted to sense the magnetic field created by the current flow in a conductor (not shown) when the first and second jaw cores 70 and 74 are operationally attached to the conductor.

The first and second jaw cores 70 and 74 are substantially identical and, therefore, only the first jaw core 70 will be described in detail. The first jaw core 70 is arcuate in shape and includes top and bottom surfaces 72 and 76 (see also FIG. 6), an outer convex surface 78, and an inner concave surface 82. The first jaw core 70 further includes an upper transverse end 84 and a lower transverse end 86. The upper transverse ends 84 of the first and second jaw cores 70 and 74 and the lower transverse ends 86 of the first and second jaw cores 70 and 74 are positionable adjacent one another when the jaw assembly 18 is in the closed position. Although the first and second jaw cores 70 and 72 are described as arcuate in shape, it should be apparent that other geometric shapes, including rectangular, are also within the scope of the present disclosure.

The upper and lower transverse ends 84 and 86 of the first jaw core 70 are covered by correspondingly shaped upper and lower end caps 112 and 116. The upper and lower end caps 112 and 116 are receivable within open ends of the first clamp jaw 34 when the top and bottom housings 46 and 50 of the first clamp jaw 34 are secured to one another. Before being covered with the upper and lower end caps 112 and 166, the first jaw core 70 is placed into communication with the flexible PCB 100. The flexible PCB 100 is constructed in a manner well known in the art to provide the appropriate circuitry for detecting electrical properties of a conductor placed within the first and second clamp jaws 70 and 74.

The first and second jaw cores 70 and 74 are receivable within first and second nonconductive shields 88 and 90 to increase creepage and clearance path within the first and second clamp jaws 34 and 38. The first and second shields 88 and 90 are substantially identical in configuration and, therefore, only the first shield 88 will be described. The first shield 88 includes a first surface 94 extending between first and second sidewalls 96 and 98 to form a channel. The channel of the first shield 88 is sized and configured to receive the first jaw core 70. More specifically, the first jaw core 70 is received within the channel of the first shield 88 such that the such that bottom surface 76 of the first jaw core 70 is exposed. The second shield 90 receives the second jaw core 74 in a similar manner.

The first shield 88 is made from any suitable rigid or semi-rigid, nonconductive material, such as Mylar, rubber, etc. During assembly, the jaw core is simply disposed within the channel of the first or second shield 88 or 90. This significantly reduces the assembly time. Moreover, there is no opportunity for the first or second shield 88 or 90 to crease, bend, wrinkle, etc., that could happen when using, for instance, insulative tape.

Figure 4:
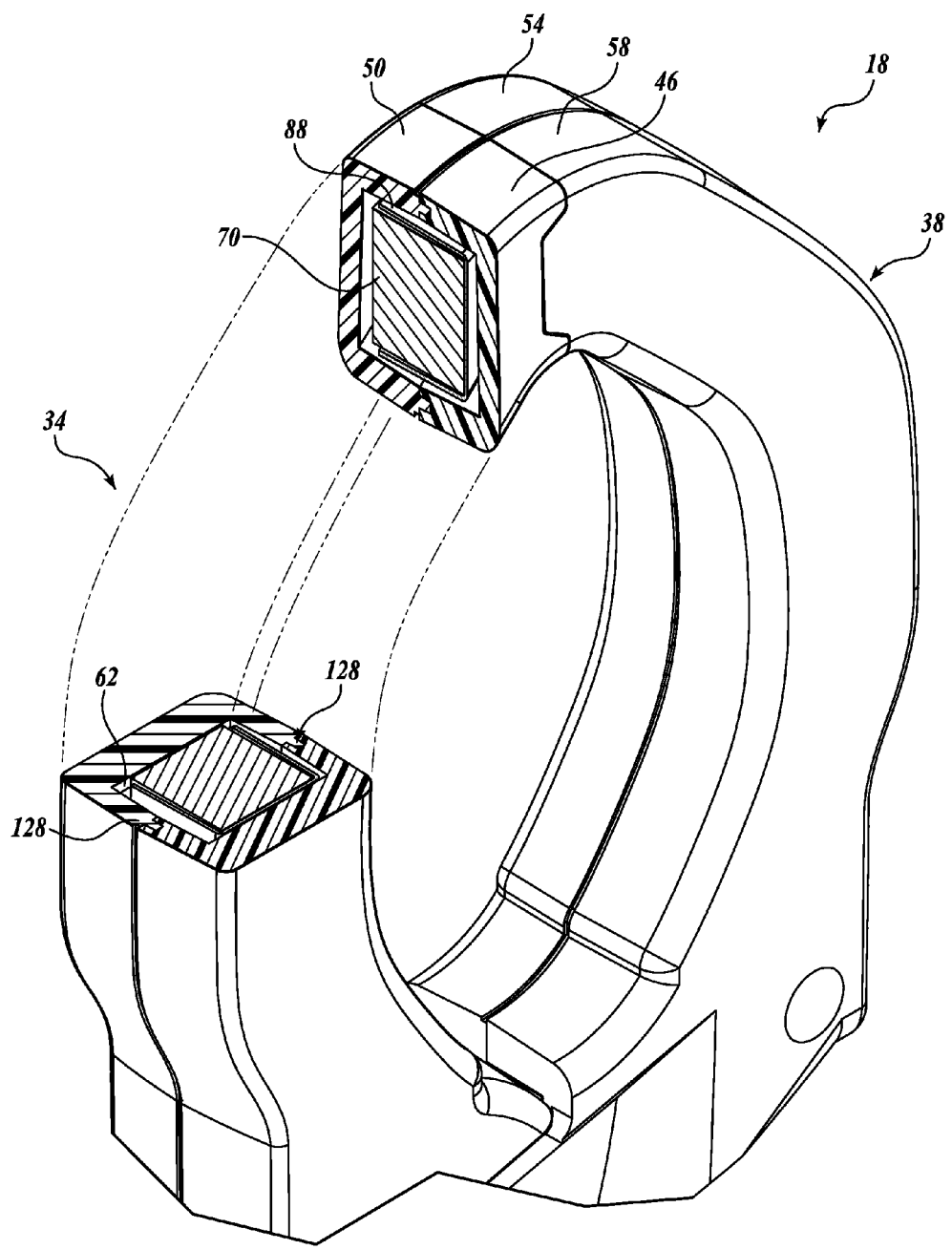
FIG. 4 is an isometric view of the clamp jaw assembly of FIG. 2, wherein a portion of the clamp jaw assembly is shown in cross-section.

Referring still to FIG. 3, the top and bottom housings 46 and 50 of first clamp jaw 34 are secured together to enclose the first jaw core 70, the first shield 88, and the flexible PCB 100. A sponge 108 or a leaf spring 104 may be disposed between the exterior of the first shield 88 and the interior of the top and bottom housings 46 and 50 to secure the components within the first clamp jaw 34. As noted above, the top and bottom housings 46 and 50 may be secured together in any suitable manner. Preferably, however, the top housing 46 includes a male mating portion 120 formed along its edge and the bottom housing 50 includes a corresponding female mating portion 124 formed along its edge. The male mating portion 120 is received within the female mating portion 124 to secure the top and bottom housings 46 and 50 together and to define an interference connection 128 therebetween, as shown in FIG. 4. The second clamp jaw 38 is assembled in a similar manner.

Figure 5:
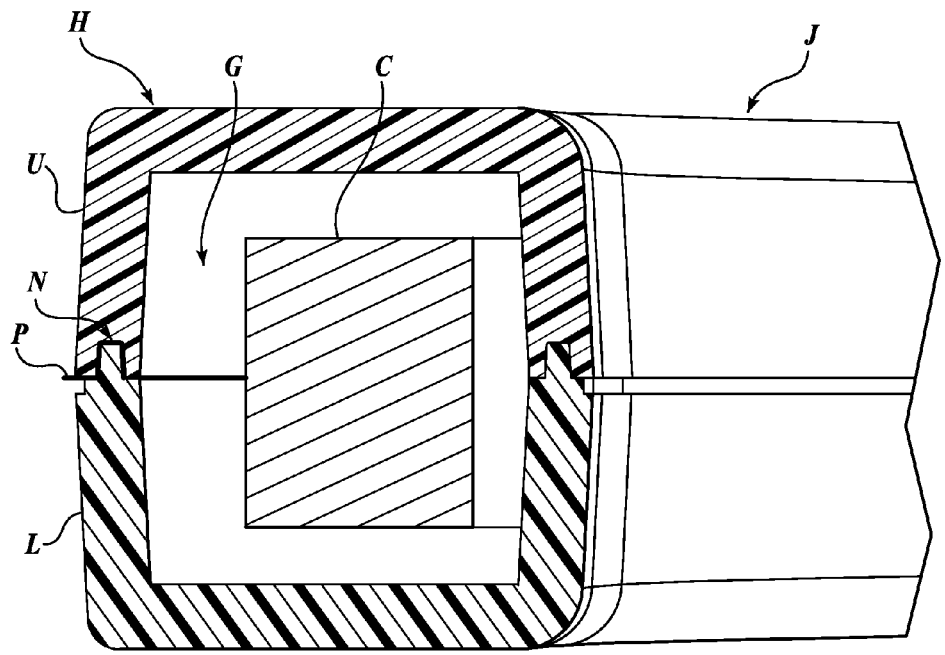
FIG. 5 is a cross-sectional end view of a portion of a prior art clamp jaw assembly.
Figure 6:
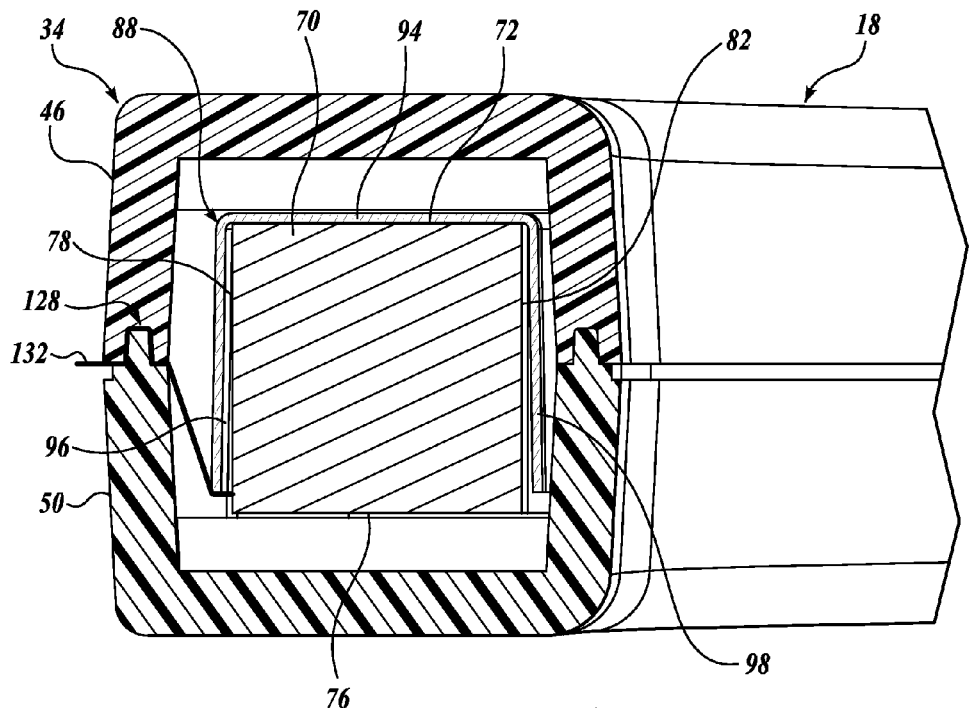
FIG. 6 is a cross-sectional end view of the clamp jaw assembly of FIG. 2.

Operation of clamp jaw assembly 18 having an improved creepage and clearance path 132 may be best understood by referring to FIGS. 5 and 6. FIG. 5 depicts a prior art clamp jaw assembly J having a core C disposed within a housing H. The housing is defined by an upper housing U and a lower housing L that are secured together through a housing connection N. A gap G is defined between the interior of housing H and the core C. The creepage and clearance path P begins on the exterior of the housing H at the housing connection N and extends through the housing connection N and across the gap G until meeting the core C. Thus, if the size of the core C was increased, the gap G would need to increase to ensure a sufficient creepage and clearance path P. Accordingly, an increased core size would increase the overall size of the jaw assembly J.

FIG. 6 depicts the creepage and clearance path 132 of the first clamp jaw 34 of the preferred jaw assembly 18. The creepage and clearance path 132 begins on the exterior of the housing (defined by the top housing 46 and the bottom housing 50) at the connection 128 and extends through the connection 128. The path 132 extends into the interior of the first clamp jaw 34 until it reaches the first sidewall 96 of the first shield 88. The path 132 is directed downwardly along the first sidewall 96 of the first shield 88 towards the exposed, bottom surface 76 of the first core 70. The path 132 ends where the first shield is no longer covering the first core 70. Thus, the first shield 88 lengthens the creepage and clearance path 132 without having to increase the distance between the first core 70 and the interior of the housing. Accordingly, the core size may be increased without having to increase the overall size of the first clamp jaw 34.

While illustrative embodiments have been illustrated and described, it will be appreciated that various changes can be made therein without departing from the spirit and scope of the invention.

The embodiments of the invention in which an exclusive property or privilege is claimed are defined as follows:

1. A clamp jaw assembly for a clamp meter, comprising a first clamp jaw movable in relation to a second clamp jaw, each of the first and second clamp jaws having a first end and a second end, said first ends being configured to secure to a body housing, and said second ends being configured to meet so as to define an enclosed area between the first and second clamp jaws;

wherein each of the first and second clamp jaws comprise:

a shield made of a nonconductive material having a channel;

a conductive clamp jaw core positioned, but not permanently fixed, within the channel of the shield, the clamp jaw core having a cross-sectional shape defined by at least first and second exterior surfaces extending between first and second ends of the clamp jaw core, wherein the first exterior surface extending between the first and second ends remains exposed; and a clamp jaw housing, made of a nonconductive material, enclosing the clamp jaw core and the shield such that the clamp jaw core and shield are not fixed to an interior surface of the camp jaw housing, the clamp jaw housing having top and bottom housings that define an interference connection therebetween extending from an exterior surface of the clamp jaw housing to an interior surface of the clamp jaw housing;

wherein a portion of the shield is positioned between the interference connection and the clamp jaw core; and wherein the clamp jaw housing, shield, and clamp jaw core are arranged to define a creepage and clearance path that extends from the exterior surface of the clamp jaw housing, along the interference connection to the interior surface of the clamp jaw housing, and towards the first exterior surface of the clamp jaw core exposed by the shield.

2. The clamp jaw assembly of claim 1, wherein at least one of the first and second clamp jaws is arcuate in shape.

3. The clamp jaw assembly of claim 1, wherein the first clamp jaw is configured to be mounted at its first end within the body housing so as to pivot relative to the second clamp jaw, which is configured to be fixedly secured within the body housing.

4. The clamp jaw assembly of claim 1, wherein the shield is made of a semi-rigid material.

5. The clamp jaw assembly of claim 1, wherein the cross-sectional shape of the clamp jaw core is defined by four exterior surfaces extending along the arc length.

6. The clamp jaw assembly of claim 5, wherein the shield includes a first surface extending between first and second sidewalls to define the channel.

7. The clamp jaw assembly of claim 1, further comprising disposing a biasing member between a portion of the shield and the interior surface of the housing.

8. The clamp jaw assembly of claim 7, wherein the biasing member is a sponge.

9. The clamp jaw assembly of claim 7, wherein the biasing member is a spring.

10. The clamp jaw assembly of claim 1, further comprising a circuit for detecting electrical properties of a conductor placed within the enclosed area formed between the first and second clamp jaws.

11. A clamp meter including a clamp jaw assembly, the clamp jaw assembly comprising a first clamp jaw movable in relation to a second clamp jaw, each of the first and second clamp jaws having a first end and a second end, said first ends being secured to a body housing of the claim meter, and said second ends being configured to meet so as to define an enclosed area between the first and second clamp jaws;

wherein each of the first and second clamp jaws comprise:

a shield made of a nonconductive material having a channel;

a conductive clamp jaw core positioned, but not permanently fixed, within the channel of the shield, the clamp jaw core having a cross-sectional shape defined by at least first and second exterior surfaces extending between first and second ends of the clamp jaw core, wherein the first exterior surface extending between the first and second ends remains exposed; and a clamp jaw housing, made of a nonconductive material, enclosing the clamp jaw core and the camp jaw shield such that the clamp jaw core and shield are not fixed to an interior surface of the housing, the clamp jaw housing having top and bottom housings that define an interference connection therebetween extending from an exterior surface of the clamp jaw housing to an interior surface of the clamp jaw housing;

wherein a portion of the shield is positioned between the interference connection and the clamp jaw core; and wherein the clamp jaw housing, shield, and clamp jaw core are arranged to define a creepage and clearance path that extends from the exterior surface of the clamp jaw housing, along the interference connection to the interior surface of the clamp jaw housing, and towards the first exterior surface of the clamp jaw core exposed by the shield.

* * * * *

UNITED STATES PATENT AND TRADEMARK OFFICE
CERTIFICATE OF CORRECTION

PATENT NO. : 8,159,211 B2
APPLICATION NO. : 12/979216
DATED : April 17, 2012
INVENTOR(S) : Y. Wang et al.

Page 1 of 1

It is certified that error appears in the above-identified patent and that said Letters Patent is hereby corrected as shown below:

In the Claims

| COLUMN | LINE | ERROR |
|---|---|---|
| 5 (Claim 1, | 19 line 21) | "surface of the camp" should read --surface of the clamp-- |
| 6 (Claim 11, | 16 line 5) | "claim meter," should read --clamp meter,-- |
| 6 (Claim 11, | 30 line 19) | "camp jaw shield" should read --shield-- |
| 6 (Claim 11, | 32 line 21) | "surface of the housing," should read --surface of the clamp jaw housing-- |

Signed and Sealed this
Tenth Day of December, 2013

Margaret A. Focarino
*Commissioner for Patents of the United States Patent and Trademark Office*